United States Patent [19]
Tokura

[11] Patent Number: 5,272,517
[45] Date of Patent: Dec. 21, 1993

[54] HEIGHT MEASUREMENT APPARATUS USING LASER LIGHT BEAM

[75] Inventor: Nobufumi Tokura, Fukuoka, Japan

[73] Assignee: Matsushita Electric Industrial Co., Ltd., Osaka, Japan

[21] Appl. No.: 902,152

[22] Filed: Jun. 22, 1992

Related U.S. Application Data

[63] Continuation-in-part of Ser. No. 713,365, Jun. 12, 1991, abandoned.

[30] Foreign Application Priority Data

Jun. 13, 1990 [JP] Japan .................... 2-154765

[51] Int. Cl.$^5$ ............................................. G01B 11/14
[52] U.S. Cl. ........................................................ 356/375
[58] Field of Search ....................... 356/371, 375, 376

[56] References Cited

U.S. PATENT DOCUMENTS 4,589,773 5/1986 Ido et al. ........................... 356/376
4,971,443 11/1990 Koyagi ............................. 356/375

FOREIGN PATENT DOCUMENTS 180104 8/1986 Japan ................................ 356/375

*Primary Examiner*—Richard A. Rosenberger
*Attorney, Agent, or Firm*—Lowe, Price, LeBlanc & Becker

[57] ABSTRACT

In a height measurement apparatus, a laser light beam is applied to a surface of a height-measurement object. A portion of the laser light beam is reflected at the surface of the object. An optical position sensor is exposed to the portion of the laser light beam which is reflected at the surface of the object. The optical position sensor generates a position signal depending on a point at which the reflected laser light beam meets the optical position sensor. The position signal represents a height of the surface of the object. A position of the laser light beam is vibrated relative to the surface of the object. The height represented by the position signal is temporally averaged into a mean height while the position of the laser light beam is vibrated relative to the surface of the object. The mean height is defined as a final measurement result.

7 Claims, 7 Drawing Sheets

HEIGHT MEASUREMENT APPARATUS USING LASER LIGHT BEAM

CROSS-REFERENCES TO RELATED APPLICATIONS

This is a continuation-in-part of U.S. Pat. application Ser. No. 713,365, filed on Jun. 12, 1991 now abandoned.

BACKGROUND OF THE INVENTION

This invention relates to a height measurement apparatus using a laser light beam.

In some of height measurement apparatus, a laser light spot is applied to a surface of a measured object, and the applied laser light is reflected at the surface of the object before entering an optical position sensor. A position at which the reflected laser light meets the optical position sensor depends on the height of the surface of the object. The optical position sensor outputs an electric signal depending on the position exposed to the reflected laser light. Thus, the output signal of the optical position sensor represents the height of the surface of the object.

U.S. Pat. No. 4,589,773 discloses a similar height measurement apparatus.

Such a height measurement apparatus can be used in a system for inspecting solder portions of a circuit board as suggested in U.S. Pat. No. 5,103,105. It should be noted that U.S. Pat. No. 5,103,105 is not prior art to this invention.

As will be explained later, a prior-art height measurement apparatus has some problem.

SUMMARY OF THE INVENTION

It is an object of this invention to provide an improved height measurement apparatus using a laser light beam.

A first aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam which is reflected at the surface of the object, for generating a position signal depending on a point at which the reflected laser light beam meets the optical position sensor, wherein the position signal representing a height of the surface of the object; means for vibrating a position of the laser light beam relative to the surface of the object; means for temporally averaging the height represented by the position signal into a mean height while the vibrating means vibrates the position of the laser light beam relative to the surface of the object; and means for defining the mean height as a final measurement result.

A second aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam reflected at the surface of the object, for generating a position signal depending on a point at which the reflected laser light beam meets the optical position sensor, wherein the position signal representing a height of the surface of the object; means for varying an effective length of a path of the laser light beam which extends to the surface of the object; means for temporally averaging the height represented by the position signal into a mean height while the varying means varies the effective length of the path of the laser light beam; and means for defining the mean height as a final measurement result.

A third aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam reflected at the surface of the object, for generating a position signal depending on a point at which the reflected laser light beam meets the optical position sensor, wherein the position signal representing a height of the surface of the object; means for rotating the laser light beam about its central aids; means for temporally averaging the height represented by the position signal into a mean height while the rotating means rotates the laser light beam; and means for defining the mean height as a final measurement result.

A fourth aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam reflected at the surface of the object, for generating a position signal depending on a point at which the reflected laser light beam meets the optical position sensor, wherein the position signal representing a height of the surface of the object; means for varying a wavelength of the laser light beam; means for temporally averaging the height represented by the position signal into a mean height while the varying means varies the wavelength of the laser light beam; and means for defining the mean height as a final measurement result.

A fifth aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam reflected at the surface of the object, for generating a position signal depending on a point at which the reflected laser light beam meets the optical position sensor, wherein the position signal representing a height of the surface of the object; means for varying interference conditions of the laser light beam on the surface of the object; means for temporally averaging the height represented by the position signal into a mean height while the varying means varies the interference conditions of the laser light beam on the surface of the object; and means for defining the mean height as a final measurement result.

A sixth aspect of this invention provides a height measurement apparatus comprising means for applying a laser light beam to a surface of a height-measurement object, wherein a portion of the laser light beam is reflected at the surface of the object; an optical position sensor, exposed to the portion of the laser light beam reflected at the surface of the object, for generating a position signal depending on a point at which the reflected laser light beam meets the optical position sensor, wherein the position signal representing a height of the surface of the object, means for varying interference conditions of the laser light beam on the surface of the object; means for temporally averaging the position signal into a mean signal while the varying means varies the interference conditions of the laser light beam on the surface of the object; and means for outputting the mean signal as an indication of a final measurement result.

BRIEF DESCRIPTION OF THE DRAWINGS

FIG. 13 is a diagram of a height measurement apparatus according to a fourth embodiment of this invent on.

DESCRIPTION OF THE PRIOR ART

Figure 1:
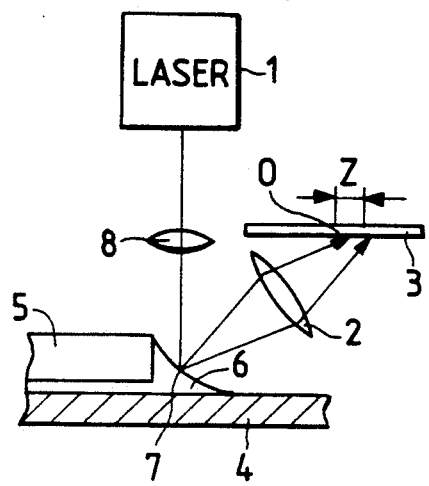
FIG. 1 is a diagram of a prior-art height measurement apparatus.

With reference to FIG. 1, a prior-art height measurement apparatus includes a laser 1 emitting a beam of light toward a lens 8. The laser light beam is incident to the lens 8, being focused by the lens 8 into a spot on a point 7 of a surface of a solder portion 6 related to circuit parts 5 on a printed circuit board 4. The laser light beam is reflected at the point 7 toward a lens 2, being condensed by the lens 2. After passing through the lens 2, the laser light beam reaches an optical position sensor (a position sensing device, "PSD") 3.

The position at which the reflected laser light beam meets the optical position sensor 3 depends on the height of the point 7 of the surface of the solder portion 6 relative to the upper surface of the printed circuit board 4. The optical position sensor 3 outputs an electric signal depending on the position exposed to the reflected laser light beam. Thus, the output signal of the optical position sensor 3 represents the height of the point 7 of the surface of the solder portion 6.

Figure 2:
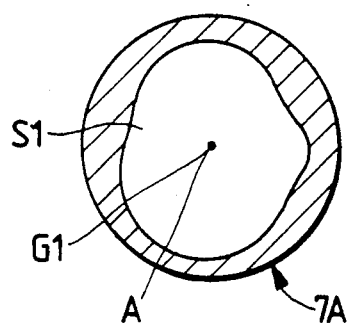
FIGS. 2-4 are diagrams showing examples of conditions of a laser light spot on a surface of a measured object in the prior-art apparatus of FIG. 1.
Figure 3:
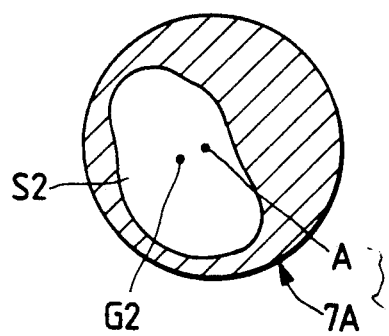
Figure 4:
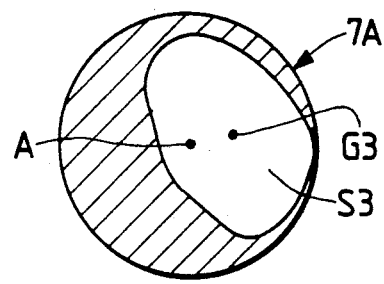

In fact, the laser light spot has a certain diameter. Thus, the point 7 of the surface of the solder portion 6 which is exposed to the laser light spot differs from a true point but equals a small circular region. FIGS. 2-4 show examples of conditions of a small circular region 7A of the surface of the solder portion 6 which is exposed to the laser light spot. As shown in FIGS. 2-4, the small circular region 7A is divided into a bright section S1, S2, or S3 and a dark section corresponding to a non-hatched section and a hatched section respectively.

Figure 5:
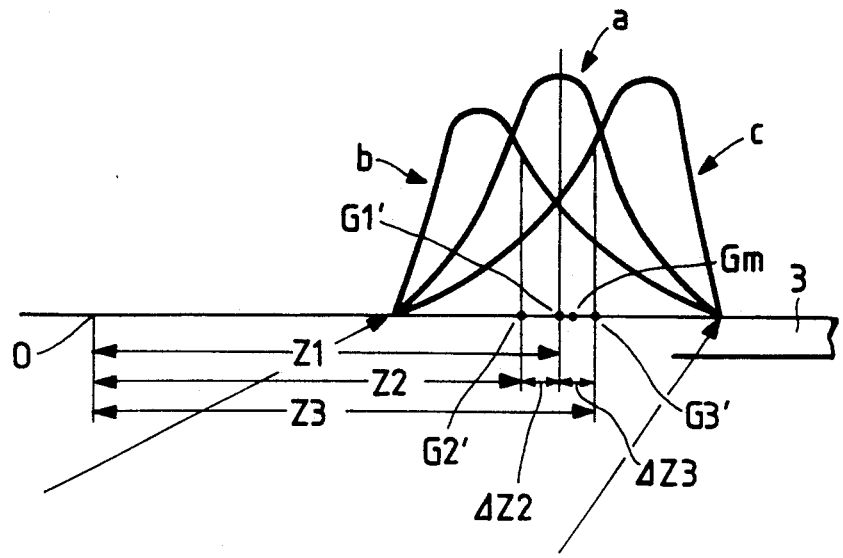
FIG. 5 is a diagram showing examples of the relation between a distribution of the intensity of the laser light beam and the optical position sensor in the prior-art apparatus of FIG. 1.

Under the conditions of FIG. 2, the bright section S1 is approximately centered or concentric with the small circular region 7A so that the centroid (the center of gravity) G1 of the bright section S1 essentially coincides with the center A of the small circular region 7A. In this case, as shown by the curve "a" in FIG. 5, the reflected laser light beam reaching the optical position sensor 3 has a normal distribution in intensity on the optical position sensor 3. The output signal of the optical position sensor 3 depends on the distribution of the intensity of the reflected laser light beam. In FIG. 5, the character G1' denotes the position of the centroid (the center of gravity) of the intensity distribution of the reflected laser light beam on the optical position sensor 3 which occurs under the conditions of FIG. 2. Specifically, the output signal of the optical position sensor 3 represents the centroid position G1'. Under the conditions of FIG. 2, the position G1' of the centroid of the intensity distribution of the reflected laser light beam on the optical position sensor 3 accurately represents the height of the point 7 of the surface of the solder portion 6 relative to the upper surface of the printed circuit board 4. Specifically, the distance Z1 between the centroid position G1' and a given reference point O on the optical position sensor 3 represents the height of the point 7 of the surface of the solder portion 6. The reference point O is predetermined so as to correspond to the position of the upper surface of the printed circuit board 4. Accordingly, under the conditions of FIG. 2, the output signal of the optical position sensor 3 accurately represents the height of the point 7 of the surface of the solder portion 6.

Under the conditions of FIG. 3, the bright section S2 is significantly off-centered with the small circular region 7A so that the centroid (the center of gravity) G2 of the bright section S2 considerably separates from the center A of the small circular region 7A. In this case, as shown by the curve "b" in FIG. 5, the reflected laser light beam reaching the optical position sensor 3 has a biased or inclined distribution in intensity on the optical position sensor 3. The output signal of the optical position sensor 3 depends on the distribution of the intensity of the reflected laser light beam. In FIG. 5, the character G2' denotes the position of the centroid (the center of gravity) of the intensity distribution of the reflected laser light beam on the optical position sensor 3 which occurs under the conditions of FIG. 3. Specifically, the output signal of the optical position sensor 3 represents the centroid position G2'. Under the conditions of FIG. 3, the position G2' of the centroid of the intensity distribution of the reflected laser light beam on the optical position sensor 3 does not accurately represent the height of the point 7 of the surface of the solder portion 6 relative to the upper surface of the printed circuit board 4. Specifically, the distance Z2 between the centroid position G2' and the reference point O on the optical position sensor 3 is shorter than the correct distance by an appreciable error ΔZ2. Accordingly, under the conditions of FIG. 3, the output signal of the optical position sensor 3 does not accurately represent the height of the point 7 of the surface of the solder portion 6.

Under the conditions of FIG. 4, the bright section S3 is significantly off-centered with the small circular region 7A so that the centroid (the center of gravity) G3 of the bright section S3 considerably separates from the center A of the small circular region 7A. In this case, as shown by the curve "c" in FIG. 5, the reflected laser light beam reaching the optical position sensor 3 has a biased or inclined distribution in intensity on the optical position sensor 3. The output signal of the optical position sensor 3 represents the distribution of the intensity of the reflected laser light beam. In FIG. 5, the character G3' denotes the position of the centroid (the center of gravity) of the intensity distribution of the reflected laser light beam on the optical position sensor 3 which occurs under the conditions of FIG. 4. Specifically, the output signal of the optical position sensor 3 represents the centroid position G3'. Under the conditions of FIG. 4, the position G3' of the centroid of the intensity distribution of the reflected laser light beam on the optical position sensor 3 does not accurately represent the height of the point 7 of the surface of the solder portion 6 relative to the upper surface of the printed circuit board 4. Specifically, the distance Z3 between the centroid position G3' and the reference point O on the optical position sensor 3 is longer than the correct distance by an appreciable error ΔZ3. Accordingly, under the conditions of FIG. 4, the output signal of the optical position sensor 3 does not accurately represent the height of the point 7 of the surface of the solder portion 6.

It is general that, as shown in FIGS. 2-4, the small circular region 7A is divided into a bright section and a dark section which have varying shapes and which occupy varying places. The reason for this fact will now be explained. Since the light beam emitted from the laser 1 is coherent, interference tends to occur even within the light beam. Such interference causes fringes or a higher-intensity portion and a lower-intensity portion (corresponding to a bright section and a dark section) in the light beam. The interference conditions depend on factors such as the length of a path along which the laser light beam travels, and the wavelength of the laser light beam. The shapes of the bright section and the dark section, and the places occupied by the bright section and the dark section are determined mainly by the interference conditions.

As understood from the previous description, the interference conditions affect the accuracy of the detected height of the point 7 of the surface of the solder portion 6 which is represented by the output signal of the optical position sensor 3. Canceling the interference conditions in the height detection has been desired for enhancing the accuracy of the height detection.

DESCRIPTION OF THE FIRST PREFERRED EMBODIMENT

Figure 6:
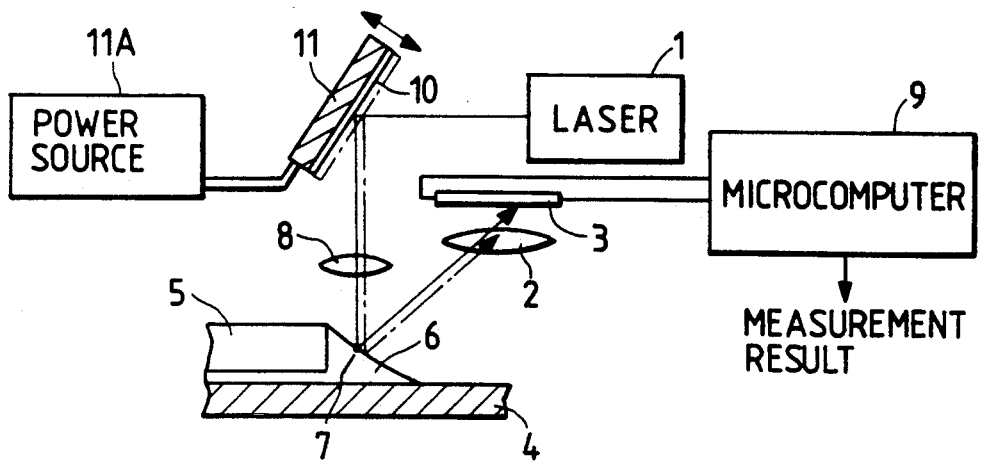
FIG. 6 is a diagram of a height measurement apparatus according to a first embodiment of this invention.

With reference to FIG. 6, a height measurement apparatus includes a laser 1 emitting a beam of light toward a mirror 10. The laser light beam is incident to the mirror 10, being reflected toward a lens 8 by the mirror 10. The laser light beam is incident to the lens 8, being focused by the lens 8 into a spot on a point 7 of a surface of a solder portion 6 related to circuit parts 5 on a printed circuit board 4. The laser light beam is reflected at the point 7 toward a lens 2, being condensed by the lens 2. After passing through the lens 2, the laser light beam reaches an optical position sensor (a position sensing device, "PSD") 3.

The position at which the reflected laser light beam meets the optical position sensor 3 depends on the height of the point 7 of the surface of the solder portion 6 relative to the upper surface of the printed circuit board 4. The optical position sensor 3 outputs an electric signal depending on the position exposed to the reflected laser light beam. Thus, the output signal of the optical position sensor 3 represents the height of the point 7 of the surface of the solder portion 6.

Figure 7:
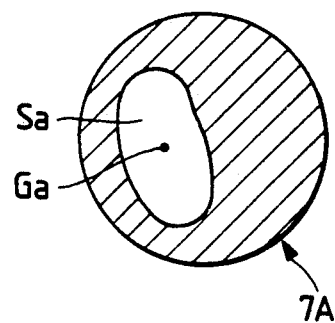
FIGS. 7 and 8 are diagrams showing examples of conditions of a laser light spot on a surface of a measured object in the apparatus of FIG. 6.
Figure 8:
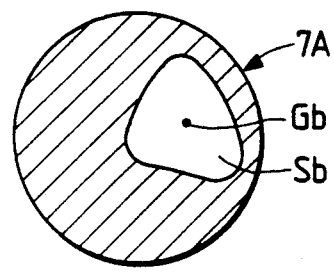

In fact, the laser light spot has a certain diameter. Thus, the point 7 of the surface of the solder portion 6 which is exposed to the laser light spot differs from a true point but equals a small circular region. FIGS. 7 and 8 show examples of different conditions of a small circular region 7A of the surface of the solder portion 6 which is exposed to the laser light spot. As shown in FIGS. 7 and 8, the small circular region 7A is divided into a bright section Sa or Sb and a dark section corresponding to a non-hatched section and a hatched section respectively. As described previously, the shapes of the bright section and the dark section, and the places occupied by the bright section and the dark section depend on the interference conditions of the laser light beam.

Figure 9:
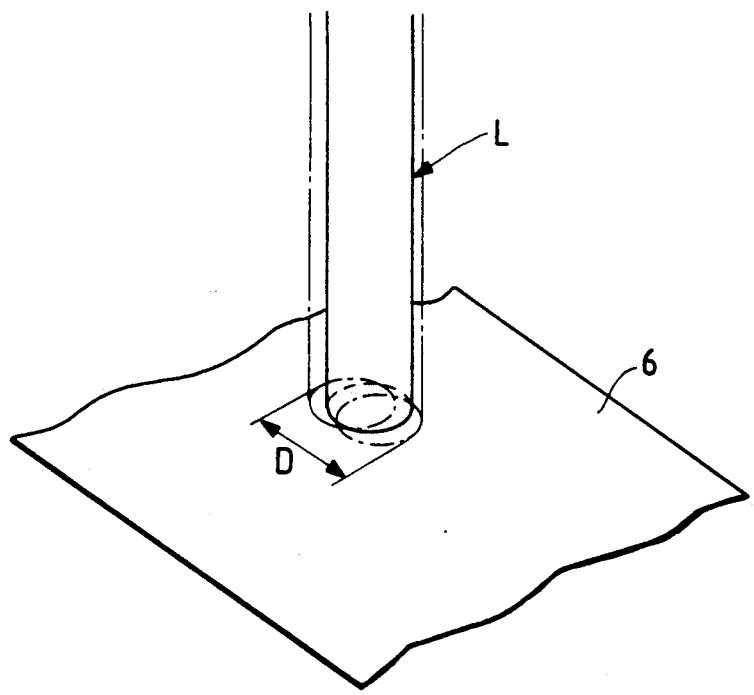
FIG. 9 is a perspective diagram showing the laser light beam on the surface of the measured object in the apparatus of FIG. 6.

The mirror 10 can be moved by an actuator 11 including a piezoelectric element. The actuator 11 is driven by a given-frequency signal fed from an electric power source 11A, so that the mirror 10 is vibrated at the given frequency. As shown in FIG. 9, the laser light beam L incident to the surface of the solder portion 6 vibrates between first and second limit positions in a range D in accordance with the vibration of the mirror 10. The first and second limit positions in the range D relate to different lengths of a path along which the laser light beam travel, and thus relate to different interference conditions respectively. Accordingly, during the vibration of the laser light beam L, the interference conditions vary periodically and also the shapes and the positions of the bright section and the dark section vary periodically. For example, the conditions of FIG. 7 occur when the laser light beam L occupies the first limit position in the range D, and the conditions of FIG. 8 occur when the laser light beam L occupies the second limit position in the range D. As will be made clear later, the center of the range D agrees with the measurement-object point of the surface of the solder portion 6.

Under the conditions of FIG. 7, the bright section Sa is significantly off-centered with the small circular region 7A so that the centroid (the center of gravity) Ga of the bright section Sa considerably separates from the center of the small circular region 7A. In this case, the reflected laser light beam reaching the optical position sensor 3 has a biased or inclined distribution in intensity on the optical position sensor 3. The output signal of the optical position sensor 3 represents the position Ga' of the centroid of the intensity distribution.

Under the conditions of FIG. 8, the bright section Sb is significantly off-centered with the small circular region 7A so that the centroid (the center of gravity) Gb of the bright section Sb considerably separates from the center of the small circular region 7A. In this case, the reflected laser light beam reaching the optical position sensor 3 has a biased or inclined distribution in intensity on the optical position sensor 3. The output signal of the optical position sensor 3 represents the position Gb' of the centroid of the intensity distribution. The centroid Ga in FIG. 7 and the centroid Gb in FIG. 8 exist at opposite sides of the center of the small circular region 7A respectively.

Figure 10:
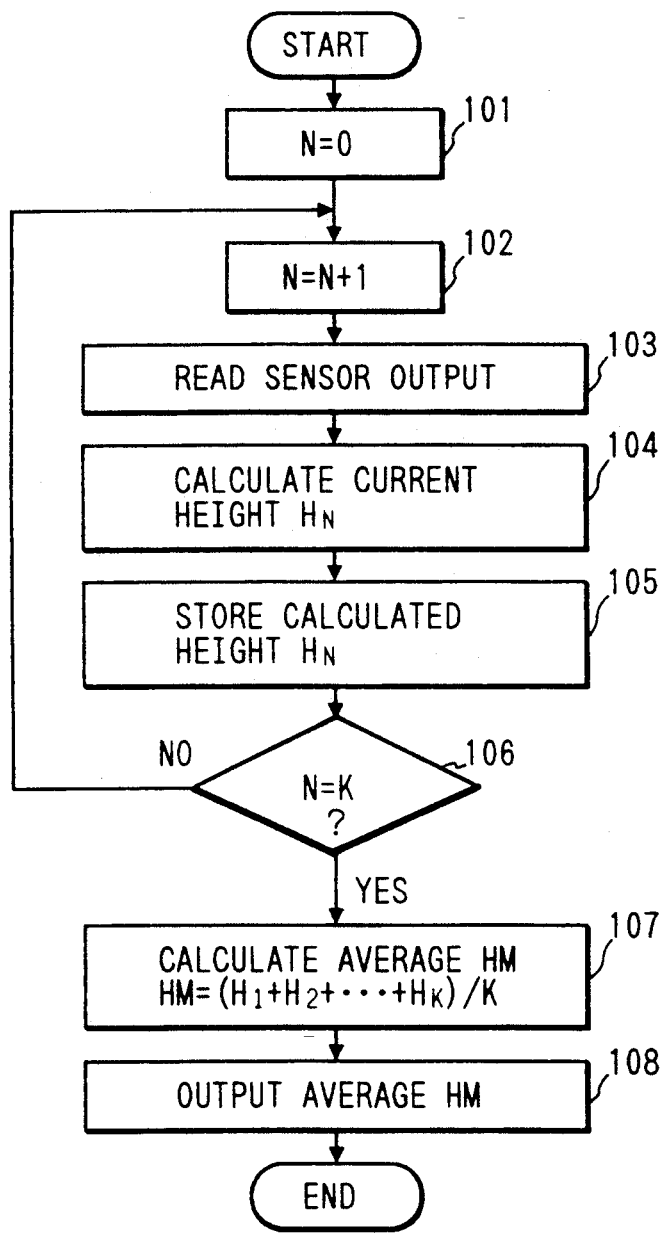
FIG. 10 is a flowchart of a program operating the microcomputer in the apparatus of FIG. 6.

As shown in FIG. 6, the height measurement apparatus also includes a microcomputer 9 receiving the output signal of the optical position sensor 3. The microcomputer 9 has a combination of a CPU, a ROM, a RAM, and an I/O section. The I/O section includes an A/D converter which converts the output signal of the optical position sensor 3 into a corresponding digital signal. The microcomputer 9 operates in accordance with a program stored in the ROM. FIG. 10 is a flowchart of the program. While the mirror 10 is vibrated and thus the laser light beam is vibrated, the computer 9 operates to calculate the height of the measurement-object point of the surface of the solder portion 6.

As shown in FIG. 10, a first step 101 of the program initializes an integer-representing variable N to "0". After the step 101, the program advances to a step 102 which increments the number N by "1". A step 103 following the step 102 reads out data representing the current output signal of the optical position sensor 3. A step 104 following the step 103 calculates a height HN of the point of the surface of the solder portion 6 on the basis of the data read out by the step 103. The calculated height HN relates to the point of the surface of the solder portion 6 which is currently exposed to the laser light beam. A step 105 following the step 104 stores the calculated height HN into the RAM. A step 106 following the step 105 decides whether or not the number N reaches a given natural number K. When the number N reaches the number K, the program advances to a step 107. Otherwise, the program returns to the step 102. Thus, while the mirror 10 is vibrated and thus the laser light beam is vibrated, the step 104 calculates the heights $H_1$, $H_2$, ..., and $H_K$. The step 107 reads out the heights $H_1$, $H_2$, ..., and $H_K$ from the RAM, and calculates an average or a mean HM of the heights $H_1$, $H_2$, ..., and $H_K$. A step 108 following the step 107 outputs data of the mean height HM as an indication of the detected height.

A time adjustment step (not shown) provided in the loop of the steps 102-106 is designed so that the heights $H_1$, $H_2$, ..., and $H_K$ are calculated during one cycle or one stroke of the vibration of the laser light beam. Averaging the heights $H_1$, $H_2$, ..., and $H_K$ into the mean height HM enables the interference conditions to be canceled in the height detection. Thus, the mean height HM can accurately represent the height of the measurement-object point of the surface of the solder portion 6 which agrees with the center of the range D.

DESCRIPTION OF THE SECOND PREFERRED EMBODIMENT

Figure 11:
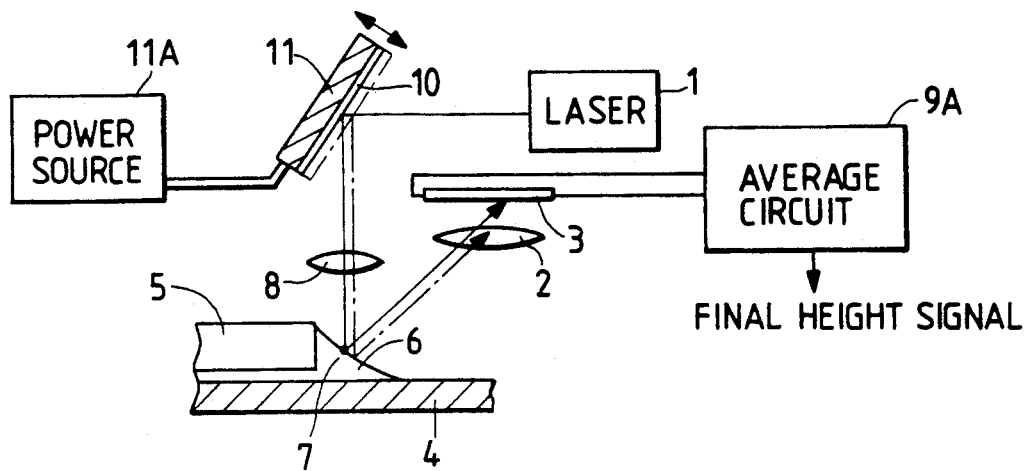
FIG. 11 is a diagram of a height measurement apparatus according to a second embodiment of this invention.

FIG. 11 shows a second embodiment of this invention which is similar to the embodiment of FIGS. 6-10 except that the computer 9 (see FIG. 6) is replaced by an averaging circuit 9A including a low pass filter or an integrator.

The averaging circuit 9A temporally averages the output signal of an optical position sensor 3 into a mean height signal representing a detected height. The mean height signal is outputted from the averaging circuit 9A.

DESCRIPTION OF THE THIRD PREFERRED EMBODIMENT

Figure 12:
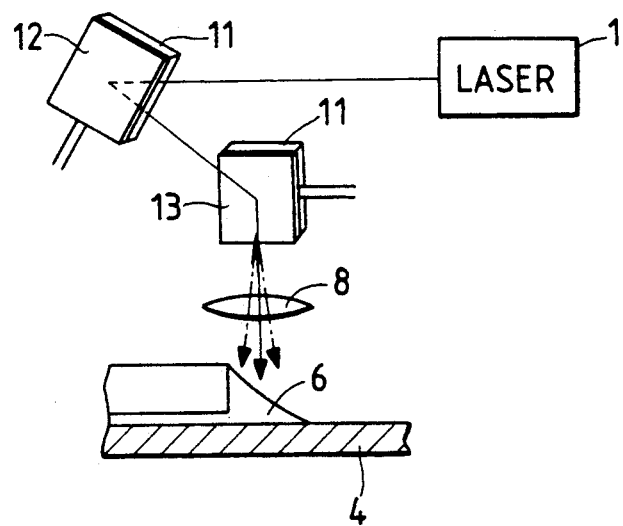
FIG. 12 is a diagram of a height measurement apparatus according to a third embodiment of this invention.

FIG. 12 shows a third embodiment of this invention which is similar to the embodiment of FIGS. 6-10 except that the mirror 10 (see FIG. 6) is replaced by mirrors 12 and 13.

A laser 1 emits a beam of light toward the mirror 12. The laser light beam is incident to the mirror 12, being reflected by the mirror 12 and being directed toward the mirror 13. The laser light beam is incident to the mirror 13, being reflected toward a lens 8 by the mirror 13. The laser light beam is incident to the lens 8, being focused by the lens 8 into a spot on a point of a surface of a solder portion 6 related to circuit parts 5 on a printed circuit board 4.

The mirror 12 can be moved by an actuator 11 including a piezoelectric element. The actuator 11 is driven by a given-frequency signal fed from an electric power source (not shown), so that the mirror 12 is vibrated at the given frequency. The laser light beam L incident to the surface of the solder portion 6 vibrates in accordance with the vibration of the mirror 12.

The mirror 13 can be moved by an actuator 11 including a piezoelectric element. The actuator 11 is driven by a given-frequency signal fed from an electric power source (not shown), so that the mirror 13 is vibrated at the given frequency. The laser light beam L incident to the surface of the solder portion 6 vibrates in accordance with the vibration of the mirror 13.

It is preferable that one of the mirrors 12 and 13 is vibrated to periodically move (vibrate) the laser light beam on the surface of the solder portion 6.

DESCRIPTION OF THE FOURTH PREFERRED EMBODIMENT

Figure 13:
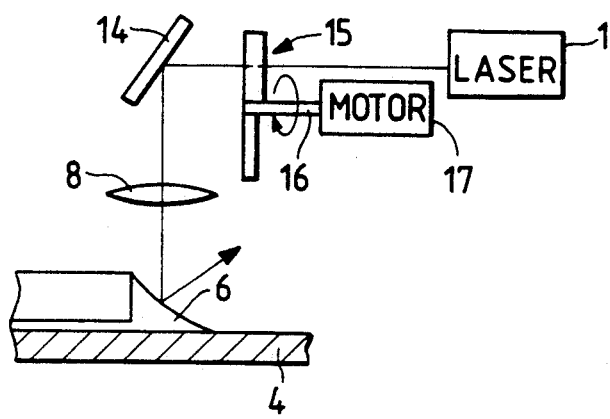

FIG. 13 shows a fourth embodiment of this invention which is similar to the embodiment of FIGS. 6-10 except for design changes indicated hereinafter.

The embodiment of FIG. 13 uses a mirror 14 in place of the mirror 10 (see FIG. 6). In addition, the embodiment of FIG. 13 includes a transparent disk 15 disposed between a laser 1 and the mirror 14.

A laser 1 emits a beam of light toward the transparent disk 15. The laser light beam is incident to the transparent disk 15, passing through the transparent disk 15 and then reaching the mirror 14. The laser light beam is reflected toward a lens 8 by the mirror 14. The laser light beam is incident to the lens 8, being focused by the lens 8 into a spot on a point of a surface of a solder portion 6 related to circuit parts 5 on a printed circuit board 4.

Figure 14:
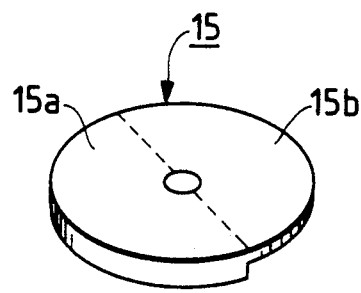
FIG. 14 is a perspective view of the transparent disk in the apparatus of FIG. 13.

The transparent disk 15 is made of suitable material such as glass or synthetic resin. As shown in FIG. 14, the transparent disk 15 has semicircular sections 15a and 15b of different thicknesses.

As shown in FIG. 13, the center of the transparent disk 15 is mounted on the rotatable shaft 16 of a motor 17. The transparent disk 15 is rotated about its center by the motor 17. During the height-measuring operation of a computer (see FIG. 6), the transparent disk 15 is rotated by the motor 17. The transparent disk 15 is positioned so that the laser light beam will pass through an off-center part of the transparent disk 15. Thus, during the rotation of the transparent disk 15, the laser light beam alternately passes through the semicircular sections 15a and 15b. Since the thicknesses of the semicircular sections 15a and 15b are different, the semicircular sections 15a and 15b provide different effective lengths of a path along which the laser light beam travels. Accordingly, the rotation of the transparent disk 15 periodically varies interference conditions of the laser light beam on the surface of the solder portion 6, and a height averaging process executed by the computer cancels the interference conditions in the height detection.

DESCRIPTION OF THE FIFTH PREFERRED EMBODIMENT

Figure 15:
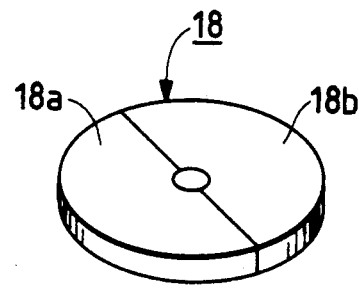
FIG. 15 is a perspective view of a transparent disk in a height measurement apparatus according to a fifth embodiment of this invention.

FIG. 15 relates to a fifth embodiment of this invention which is similar to the embodiment of FIGS. 13 and 14 except that the transparent disk 15 (see FIGS. 13 and 14) is replaced by a transparent disk 18.

As shown in FIG. 15, the transparent disk 18 has semicircular sections 18a and 18b of different refractive indexes.

DESCRIPTION OF THE SIXTH PREFERRED EMBODIMENT

Figure 16:
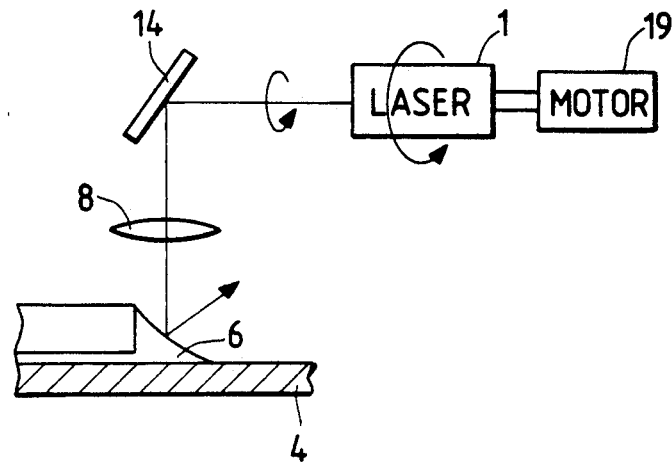
FIG. 16 is a diagram of a height measurement apparatus according to a sixth embodiment of this invention.

FIG. 16 shows a sixth embodiment of this invention which is similar to the embodiment of FIGS. 13 and 14 except for design changes indicated hereinafter. The transparent disk 15 and the motor 17 (see FIG. 13) are omitted from the embodiment of FIG. 16. Thus, in the embodiment of FIG. 16, the light beam emitted from a laser 1 is directly applied to a mirror 14.

In the embodiment of FIG. 16, the laser 1 is rotated about its optical axis by a motor 19. During the height-measuring operation of a computer (see FIG. 6), the laser 1 is rotated by the motor 17 so that the laser light beam on the surface of a solder portion 6 is also rotated. The interference conditions of the laser light beam on the surface of the solder portion 6 vary in accordance with the rotation thereof, and a height averaging process executed by the computer cancels the interference conditions in the height detection.

DESCRIPTION OF THE SEVENTH PREFERRED EMBODIMENT

Figure 17:
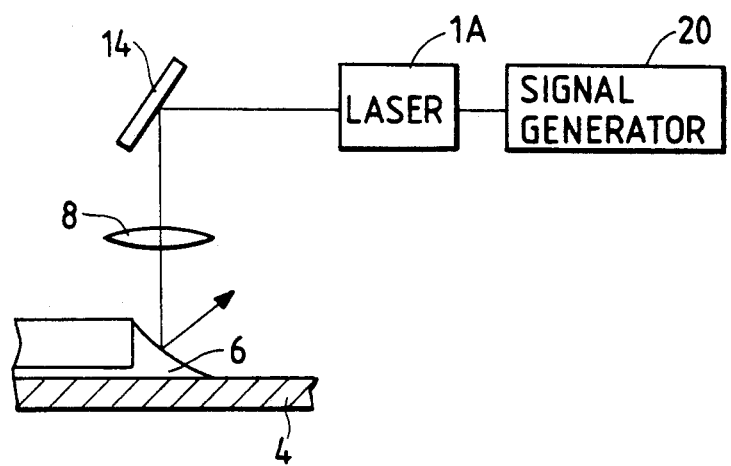
FIG. 17 is a diagram of a height measurement apparatus according to a seventh embodiment of this invention.

FIG. 17 shows a seventh embodiment of this invention which is similar to the embodiment of FIG. 16 except for design changes indicated hereinafter. The motor 19 (see FIG. 16) is omitted from the embodiment of FIG. 17.

The embodiment of FIG. 17 includes a variable-frequency laser 1A in place of the laser 1 (see FIG. 16). The wavelength of the light beam emitted from the laser 1A periodically varies in accordance with a given-frequency signal fed from a generator 20.

During the height-measuring operation of a computer (see FIG. 6), the wavelength of the laser light beam on the surface of a solder portion 6 periodically varies. The interference conditions of the laser light beam on the surface of the solder portion 6 vary in accordance with the variation in the wavelength thereof, and a height averaging process executed by the computer cancels the interference conditions in the height detection.

What is claimed is:

1. A height measurement apparatus comprising:
   means for applying a laser light beam to a surface of a height-measurement object, wherein a portion of the laser light beam is reflected at the surface of the object;
   an optical position sensor, exposed to the portion of the laser light beam which is reflected at the surface of the object, for generating a position signal depending on a point at which the reflected laser light beam meets the optical position sensor, wherein the position signal representing a height of the surface of the object;
   means for vibrating a position of the laser light beam relative to the surface of the object;
   means for temporally averaging the height represented by the position signal into a mean height while the vibrating means vibrates the position of the laser light beam relative to the surface of the object; and
   means for defining the mean height as a final measurement result.

2. The height measurement apparatus of claim 1, wherein the vibrating means comprises a mirror directing the laser light beam toward the surface of the object, and means for vibrating the mirror.

3. A height measurement apparatus comprising:
   means for applying a laser light beam to a surface of a height-measurement object, wherein a portion of the laser light beam is reflected at the surface of the object;
   an optical position sensor, exposed to the portion of the laser light beam reflected at the surface of the object, for generating a position signal depending on a point at which the reflected laser light beam meets the optical position sensor, wherein the position signal representing a height of the surface of the object;
   means for varying an effective length of a path of the laser light beam which extends to the surface of the object;
   means for temporally averaging the height represented by the position signal into a mean height while the varying means varies the effective length of the path of the laser light beam; and
   means for defining the mean height as a final measurement result.

4. A height measurement apparatus comprising:
   means for applying a laser light beam to a surface of a height-measurement object, wherein a portion of the laser light beam is reflected at the surface of the object;
   an optical position sensor, exposed to the portion of the laser light beam reflected at the surface of the object, for generating a position signal depending on a point at which the reflected laser light beam meets the optical position sensor, wherein the position signal representing a height of the surface of the object;
   means for rotating the laser light beam about its central axis;
   means for temporally averaging the height represented by the position signal into a mean height while the rotating means rotates the laser light beam; and
   means for defining the mean height as a final measurement result.

5. A height measurement apparatus comprising:
   means for applying a laser light beam to a surface of a height-measurement object, wherein a portion of the laser light beam is reflected at the surface of the object;
   an optical position sensor, exposed to the portion of the laser light beam reflected at the surface of the object, for generating a position signal depending on a point at which the reflected laser light beam meets the optical position sensor, wherein the position signal representing a height of the surface of the object;
   means for varying a wavelength of the laser light beam;
   means for temporally averaging the height represented by the position signal into a mean height while the varying means varies the wavelength of the laser light beam; and means for defining the mean height as a final measurement result.

6. A height measurement apparatus comprising:
means for applying a laser light beam to a surface of a height-measurement object, wherein a portion of the laser light beam is reflected at the surface of the object;
an optical position sensor, exposed to the portion of the laser light beam reflected at the surface of the object, for generating a position signal depending on a point at which the reflected laser light beam meets the optical position sensor, wherein the position signal representing a height of the surface of the object;
means for varying interference conditions of the laser light beam on the surface of the object;
means for temporally averaging the height represented by the position signal into a mean height while the varying means varies the interference conditions of the laser light beam on the surface of the object; and means for defining the mean height as a final measurement result.

7. A height measurement apparatus comprising:
means for applying a laser light beam to a surface of a height-measurement object, wherein a portion of the laser light beam is reflected at the surface of the object;
an optical position sensor, exposed to the portion of the laser light beam reflected at the surface of the object, for generating a position signal depending on a point at which the reflected laser light beam meets the optical position sensor, wherein the position signal representing a height of the surface of the object;
means for varying interference conditions of the laser light beam on the surface of the object;
means for temporally averaging the position signal into a mean signal while the varying means varies the interference conditions of the laser light beam on the surface of the object; and
means for outputting the mean signal as an indication of a final measurement result.

* * * * *